United States Patent [19]

McDonald et al.

[11] Patent Number: 4,980,579
[45] Date of Patent: Dec. 25, 1990

[54] ECL GATE HAVING DUMMY LOAD FOR SUBSTANTIALLY REDUCING SKEW

[75] Inventors: James T. McDonald; Rajnish Maini, both of Chandler; Harold L. Spangler, Mesa, all of Ariz.

[73] Assignee: Motorola, Inc., Schaumburg, Ill.

[21] Appl. No.: 237,370

[22] Filed: Aug. 29, 1988

[51] Int. Cl.⁵ ............... H03K 19/013; H03K 19/003; H03K 19/086; H03K 19/092
[52] U.S. Cl. .................... 307/455; 307/443; 307/475; 307/473; 307/356; 307/358
[58] Field of Search ............... 307/443, 475, 455, 467, 307/289, 290, 291, 355, 356, 358, 360, 270, 482, 578, 473

[56]  References Cited

U.S. PATENT DOCUMENTS

| 4,539,493 | 9/1985 | Varadarajan | 307/455 |
| 4,609,837 | 9/1986 | Yagyuu et al. | 307/455 |
| 4,748,346 | 5/1988 | Emori | 307/455 X |
| 4,751,406 | 6/1988 | Wilson | 307/455 |
| 4,752,703 | 6/1988 | Lin | 307/443 X |
| 4,760,289 | 7/1988 | Eichelberger et al. | 307/455 |

Primary Examiner—John S. Heyman
Assistant Examiner—David R. Bertelson
Attorney, Agent, or Firm—Michael D. Bingham

[57]  ABSTRACT

An active dummy load substantially reduces skews for input signals of a CML or an ECL series gate by generating a selectable capacitance that adjusts the delay time of the output signal in relation to the changing of the input signal to one of two states.

17 Claims, 1 Drawing Sheet

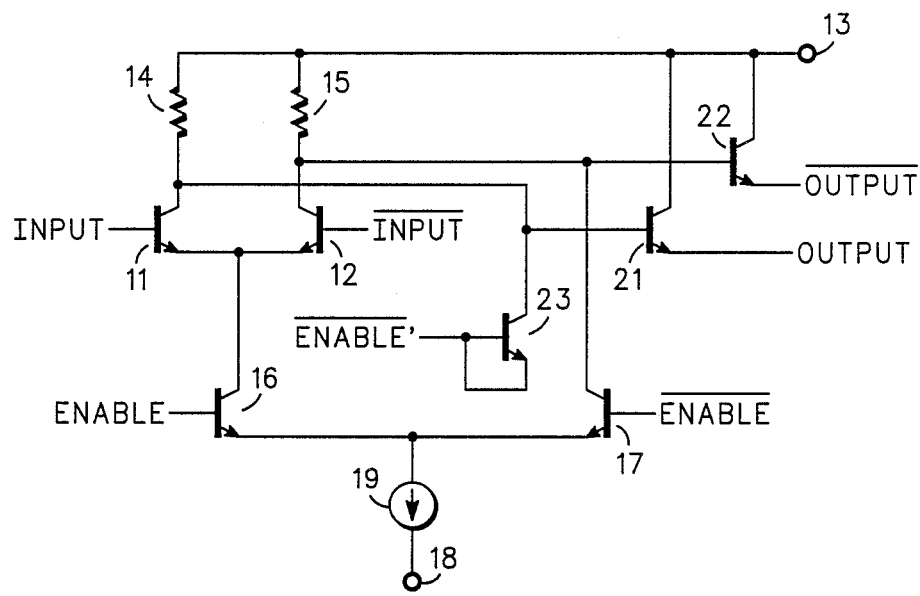
FIG. 1
FIG. 2
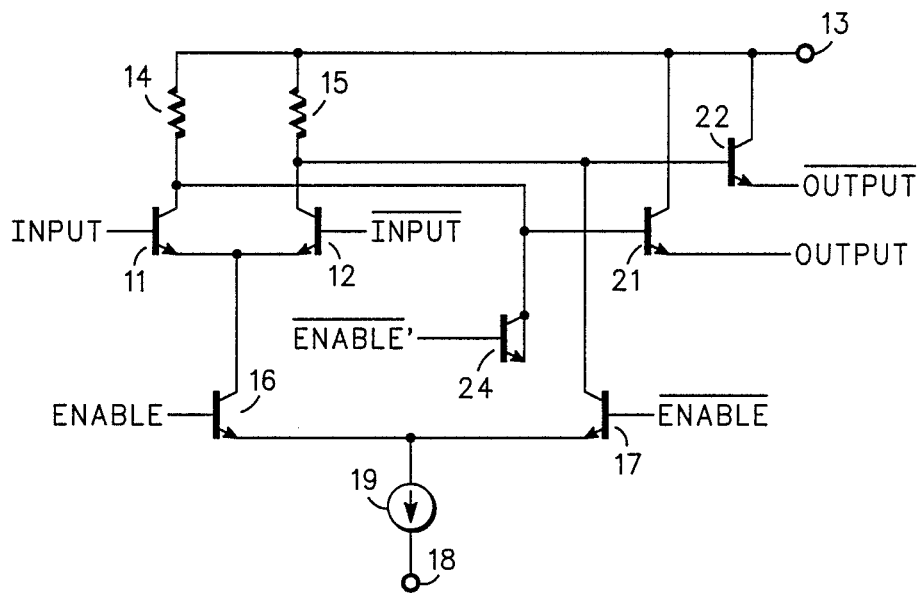

ECL GATE HAVING DUMMY LOAD FOR SUBSTANTIALLY REDUCING SKEW

FIELD OF THE INVENTION

This invention relates in general to common mode logic (CML) and emitter coupled logic (ECL) gates, and more specifically, to an active dummy load that substantially reduces output skews in response to input signals applied to a series gated circuit.

BACKGROUND OF THE INVENTION

CML and ECL gates typically comprise a first pair of differentially coupled transistors having collectors connected to a first supply voltage, bases coupled to receive an input signal and an inverted input signal, respectively, and emitters coupled to a second supply voltage by a current source. These first differentially coupled transistors provide high impedance inputs at their bases, voltage gain within the gate, insignificant power supply noise generation due to the elimination of current spikes, and nearly constant power supply current drain Some ECL gates may include an enable-disable circuit comprising a second differentially coupled transistor pair, having one collector-emitter path coupled between the emitters of the first differentially coupled transistor pair and the current source and the other collector-emitter path coupled between the collector of one of the first differentially coupled transistors and the current source. The bases of the second differentially coupled transistor pair are coupled to receive enable and inverse enable signals, respective.

For the ECL gate, first and second emitter follower transistors have their collectors connected to the first supply voltage, their bases connected to one of the collectors of the first differentially coupled transistor pair, respectively, and an emitter coupled to the second supply voltage by a resistor The emitter follower transistors restore the logic level and provide low output impedance for good line driving and high fanout capability.

However, for gates having series gating such as the enable-disable circuit described above the magnitude of the output signal skew in response to the digital input signal caused by the capacitance of the circuit on the collector of one of the first pair of differentially coupled transistors may cause problems in the circuits to which the output signal is provided.

Thus, what is needed is an ECL gate having substantially reduced output skews in response to input signals applied to a series gated circuit.

SUMMARY OF THE INVENTION

Accordingly, it is an object of the present invention to provide an improved ECL gate.

Another object of the present invention is to provide an ECL gate having reduced output skew in response to an input signal.

In carrying out the above and other objects of the invention in one form, there is provided a logic gate having a first differential pair of transistors coupled to a first supply voltage terminal and an input terminal for receiving a digital input signal and coupled to first and second output terminals for providing first and second digital output signals, respectively, in response to said digital input signal. A second pair of differentially connected transistors are coupled between a second supply voltage terminal and both said first means and said first output terminal for enabling said first means. An active load is coupled to said second output terminal for capacitively biasing said second output terminal, wherein the gate delay between the transition to a first state of said first digital input signal and the transition to a first state of said output signal and the gate delay between the transition to a second state of said first digital input signal and the transition to a second state of said output signal are substantially similar.

The above and other objects, features, and advantages of the present invention will be better understood from the following detailed description taken in conjunction with the accompanying drawings.

BRIEF DESCRIPTION OF THE DRAWING

FIG. 1 is a schematic of the preferred embodiment of the present invention.

FIG. 2 is a schematic of a second embodiment of the present invention.

DETAILED DESCRIPTION OF THE INVENTION

Referring to FIG. 1, an ECL gate includes differentially connected transistors 11 and 12 having their collectors connected to power supply terminal 13 by resistors 14 and 15, respectively, their bases coupled for receiving a digital input signal INPUT and an inverse digital input signal INPUT, respectively, and their emitters connected to the collector of transistor 16. Differentially connected transistors 16 and 17 have their bases coupled for receiving a digital enable signal ENABLE and an inverse digital enable signal ENABLE, respectively, and their emitters coupled to power supply terminal 18 by current source 19. Transistor 17 has its collector connected to the collector of transistor 12. Emitter follower transistors 21 and 22 have their collectors connected to the power supply terminal 13, their bases connected to the collectors of transistors 11 and 12, respectively, and their emitters coupled for providing a digital output signal OUTPUT and an inverse digital output signal OUTPUT. It should be understood that absent emitter follower transistors 21 and 22, the circuit described above defines what is well known in the industry as CML technology.

In accordance with the present invention, transistor 23 has a collector connected to the collector of transistor 11, and a base and emitter coupled to receive a digital inverse enable signal ENABLE'. The digital inverse enable signal ENABLE' has the same digital state as digital inverse enable signal ENABLE, but may comprise a different voltage level. A capacitance across the base-collector junction of transistor 23 effects the delay time for the signal on the collector of transistor 11, and therefore the output signal OUTPUT. The capacitance of transistor 23 effectively balences the capacitance of transistor 17 at the collectors of transistors 11 and 12, respectively. The value of the capacitance of transistor 23 may be varied by adjusting the voltage of inverse digital enable signal ENABLE'.

Referring to FIG. 2, a second embodiment is illustrated comprising a similar ECL gate, wherein like elements are numbered alike for ease of description. In accordance with the second embodiment, transistor 24 has a base coupled to receive the digital inverse enable signal ENABLE' and a collector and emitter connected to the collector of transistor 11. The capacitance provided by transistor 24 is larger in magnatude than that provided by transistor 23.

By now it should be appreciated that there has been provided a CML or ECL gate having an active dummy load that substantially reduces output skews in response to input signals applied to a series gated circuit.

We claim:

1. A logic gate comprising:
   a first supply voltage terminal;
   a second supply voltage terminal;
   a first input terminal;
   a second input terminal;
   a first output terminal;
   a second output terminal;
   first means coupled to said first supply voltage terminal and said first input terminal for receiving a first digital input signal and coupled to said first and second output terminals for providing first and second digital output signals, respectively, in response to said first digital input signal;
   second means coupled between said second supply voltage terminal and said first means and coupled to said second input terminal for receiving a second digital input signal and to said first output terminal for determining the state of said first digital output signal; and
   third means coupled to said second output terminal for capacitively biasing said second output terminal, wherein said third means causes the gate delay between the transistion to a first state of said first digital input signal and the transistion to a first state of said first output signal and the gate delay between the transistion to the first state of said first digital input signal and the transistion to a first state of said second output signal to be substantially similar.

2. The logic gate according to claim 1 wherein said third means comprises:
   a third input terminal; and
   a transistor having a collector coupled to said second output terminal, and a base and an emitter coupled to said third input terminal for receiving a third digital input signal that is the digital inverse of the second digital input signal.

3. The logic gate according to claim 1 wherein said third means comprises:
   a third input terminal; and
   a transistor having a collector and an emitter coupled to said second output terminal, and a base coupled to said third input terminal for receiving a third digital input signal that is the digital inverse of the second digital input signal.

4. The logic gate according to claim 1 wherein said first means comprises:
   fourth means for providing a resistance;
   fifth means for providing a resistance;
   a first transistor having a collector coupled to said first supply voltage terminal by said fourth means and to said second output terminal, a base coupled to said first input terminal, and an emitter coupled to said second means; and
   a second transistor having a collector coupled to said first supply voltage terminal by said fifth means and to said first output terminal, a base coupled to receive one of a first reference voltage and a third digital input signal that is the digital inverse of the first digital input signal, and an emitter coupled to said second means.

5. The logic gate according to claim 4 wherein said second means comprises:
   a current source;
   a third transistor having a collector coupled to said emitters of said first and second transistors, a base coupled to said second input terminal, and an emitter coupled to said second voltage terminal by said current source; and
   a fourth transistor having a collector coupled to said first output terminal, a base coupled to receive one of a second reference voltage and a fourth digital input signal that is the digital inverse of the second digital input signal, and an emitter coupled to said second voltage terminal by said current source.

6. The logic gate according to claim 5 wherein said third means comprises:
   a third input terminal; and
   a fifth transistor having a collector coupled to said second output terminal, and a base and an emitter coupled to said third input terminal for receiving a fifth digital input signal that is the digital inverse of the second digital input signal.

7. The logic gate according to claim 5 wherein said third means comprises:
   a third input terminal; and
   a transistor having a collector and an emitter coupled to said second output terminal, and a base coupled to said third input terminal for receiving a fifth digital input signal that is the digital inverse of the second digital input signal.

8. A logic gate comprising:
   a first supply voltage terminal;
   a second supply voltage terminal;
   a first input terminal;
   a second input terminal;
   a third input terminal;
   a first output terminal;
   a second output terminal;
   first means coupled to said first supply voltage terminal, said first input terminal and said second input terminal for receiving first and second digital input signals, respectively, said first and second digital input signals being the digital inverse of one another, and coupled to said first and second output terminals for providing first and second digital output signals, respectively, in response to said first and second digital input signals, respectively;
   second means coupled between said second supply voltage terminal and said first means and coupled to said third input terminal for receiving a third digital input signal and to said first output terminal for determining the state of said first digital output signal; and
   third means coupled to said second output terminal for capacitively biasing said second output terminal, wherein said third means causes the gate delay between the transistion to a first state of said first digital input signal and the transistion to a first state of said first output signal and the gate delay between the transistion to the first state of said second digital input signal and the transistion to a first state of said second output signal to be substantially similar, and the gate delay between the transistion to a second state of said first digital input signal and the transistion to a second state of said first output signal and the gate delay between the transistion to the second state of said second digital input signal and the transistion to a second state of said second output signal to be substantially similar.

9. The logic gate according to claim 8 wherein said third means comprises:
   a fourth input terminal; and
   a transistor having a collector coupled to said second output terminal, and a base and an emitter coupled to said fourth input terminal for receiving a fourth digital input signal that is the digital inverse of the third digital input signal.

10. The logic gate according to claim 8 wherein said third means comprises:
    a fourth input terminal; and
    a transistor having a collector and an emitter coupled to said second output terminal, and a base coupled to said fourth input terminal for receiving a fourth digital input signal that is the digital inverse of the third digital input signal.

11. The logic gate according to claim 8 wherein said first means comprises:
    fourth means for providing a resistance;
    fifth means for providing a resistance;
    a first transistor having a collector coupled to said first supply voltage terminal by said fourth means and to said second output terminal, a base coupled to said first input terminal, and an emitter coupled to said second means; and
    a second transistor having a collector coupled to said first supply voltage terminal by said fifth means and to said first output terminal, a base coupled to said second input terminal, and an emitter coupled to said second means.

12. The logic gate according to claim 11 wherein said second means comprises:
    a current source;
    a third transistor having a collector coupled to said emitters of said first and second transistors, a base coupled to said third input terminal for receiving a third digital input signal, and an emitter coupled to said second voltage terminal by said current source; and
    a fourth transistor having a collector coupled to said first output terminal, a base coupled to receive one of a second reference voltage and a fourth digital input signal that is the digital inverse of the third digital input signal, and an emitter coupled to said second voltage terminal by said current source.

13. The logic gate according to claim 12 wherein said third means comprises a fifth transistor having a collector coupled to said second output terminal, and a base and an emitter coupled to receive a fifth digital input signal that is the digital inverse of the third digital input signal.

14. The logic gate according to claim 12 wherein said third means comprises a transistor having a collector and an emitter coupled to said second output terminal, and a base coupled to receive a fifth digital input signal that is the digital inverse of the third digital input signal.

15. A logic gate comprising:
    a first supply voltage terminal;
    a second supply voltage terminal;
    first means for providing a resistance;
    second means for providing a resistance;
    a first input terminal for receiving a first digital input signal;
    a second input terminal for receiving an input voltage, said input voltage being one of a second digital input signal or a reference voltage;
    a first enable terminal for receiving an enable signal;
    a second enable terminal for receiving an inverse enable signal;
    a first output terminal for providing a first output signal;
    a second output terminal for providing a second output signal;
    a first transistor having a collector coupled to a first node, a base coupled to said first input terminal, and an emitter, said first node coupled to said first supply voltage terminal by said first means and to said first output terminal;
    a second transistor having a collector coupled to a second node, a base coupled to said second input terminal, and an emitter, said second node coupled to said first supply voltage terminal by said second means and to said second output terminal;
    a third transistor having a collector coupled to said emitters of said first and second transistors, a base coupled to said first enable terminal, and an emitter coupled to said second supply voltage terminal by said current source;
    a fourth transistor having a collector coupled to said collector of said second transistor, a base coupled to said second enable terminal, and an emitter coupled to said second supply voltage terminal by said current source; and
    third means coupled to the collector of said first transistor for capacitively biasing said second output terminal, wherein the gate delay between the transistion to a first state of said first digital input signal and the transistion to a first state of said first output signal and the gate delay between the transistion to a first state of said first digital input signal and the transistion to a first state of said second output signal are substantially similar.

16. The logic gate according to claim 15 wherein said third means comprises a transistor having a collector coupled to the collector of said first transistor, and a base and an emitter coupled to said second enable terminal.

17. The logic gate according to claim 15 wherein said third means comprises a transistor having a collector and an emitter coupled to the collector of said first transistor, and a base coupled to said second enable terminal.

* * * * *